United States Patent
Sporer

(10) Patent No.: US 11,710,676 B2
(45) Date of Patent: Jul. 25, 2023

(54) ELECTRONICS ASSEMBLIES AND METHODS OF MANUFACTURING ELECTRONICS ASSEMBLIES WITH IMPROVED THERMAL PERFORMANCE

(71) Applicant: INTELLIGENT PLATFORMS, LLC, Charlottesville, VA (US)

(72) Inventor: Bernd Sporer, Bobingen (DE)

(73) Assignee: INTELLIGENT PLATFORMS, LLC, Charlottesville, VA (US)

( * ) Notice: Subject to any disclaimer, the term of this patent is extended or adjusted under 35 U.S.C. 154(b) by 13 days.

(21) Appl. No.: 17/408,227

(22) Filed: Aug. 20, 2021

(65) Prior Publication Data

US 2021/0384098 A1 Dec. 9, 2021

Related U.S. Application Data

(62) Division of application No. 16/534,659, filed on Aug. 7, 2019, now Pat. No. 11,114,361.

(51) Int. Cl.
*H01L 23/367* (2006.01)
*H05K 1/18* (2006.01)
(Continued)

(52) U.S. Cl.
CPC ...... *H01L 23/3675* (2013.01); *H01L 21/4882* (2013.01); *H01L 23/367* (2013.01);
(Continued)

(58) Field of Classification Search
CPC . H01L 21/4882; H01L 23/12; H01L 23/3107; H01L 23/3121; H01L 23/3128; H01L 23/36; H01L 23/367; H01L 23/3675; H01L 23/40; H05K 1/181; H05K 3/22; H05K 2201/066; H05K 2201/09063; H05K 2201/1056; H05K 2203/0195
See application file for complete search history.

(56) References Cited

U.S. PATENT DOCUMENTS 6,008,536 A 12/1999 Mertol
6,188,578 B1 * 2/2001 Lin ...................... H05K 1/0203
257/E23.101

(Continued)

FOREIGN PATENT DOCUMENTS

DE 198 19 217 A1 11/1998

OTHER PUBLICATIONS

International Preliminary Report on Patentability for Application No. PCT/US2020/045185, dated Feb. 8, 2022.
(Continued)

*Primary Examiner* — Cheung Lee
(74) *Attorney, Agent, or Firm* — Marshall, Gerstein & Borun LLP

(57) ABSTRACT

Electronics assemblies and methods of manufacturing electronics assemblies having improved thermal performance. One example of these electronics assemblies includes a printed circuit board (PCB), an integrated circuit package mounted to the PCB, the integrated circuit packing having a heat generating component, and a heat spreader soldered to the PCB such that the heat spreader is thermally coupled to the heat generating component of the integrated circuit package to dissipate heat generated by the heat generating component.

18 Claims, 7 Drawing Sheets

(51) Int. Cl.
*H05K 3/22* (2006.01)
*H01L 21/48* (2006.01)

(52) U.S. Cl.
CPC ............... *H05K 1/181* (2013.01); *H05K 3/22* (2013.01); *H05K 2201/066* (2013.01); *H05K 2201/09063* (2013.01); *H05K 2201/1056* (2013.01); *H05K 2203/0195* (2013.01)

(56) References Cited

U.S. PATENT DOCUMENTS

| | | |
|---|---|---|
| 6,232,558 B1 | 5/2001 | Tsukada et al. |
| 2004/0124517 A1 | 7/2004 | Hsieh et al. |
| 2004/0135239 A1 | 7/2004 | Radu et al. |
| 2009/0289352 A1 | 11/2009 | Horie |

OTHER PUBLICATIONS

International Search Report and Written Opinion for Application No. PCT/US2020/045185, dated Nov. 11, 2020.

* cited by examiner

ELECTRONICS ASSEMBLIES AND METHODS OF MANUFACTURING ELECTRONICS ASSEMBLIES WITH IMPROVED THERMAL PERFORMANCE

CROSS-REFERENCE TO RELATED APPLICATION

This application is a divisional of U.S. patent application Ser. No. 16/534,659, entitled "Electronics Assemblies and Methods of Manufacturing Electronics Assemblies with Improved Thermal Performance," and filed Aug. 7, 2019, the entire disclosure of which is hereby incorporated by reference herein.

FIELD OF THE DISCLOSURE

The present disclosure generally relates to cooling electronics devices, and, more particularly, to electronics assemblies and methods of manufacturing electronics assemblies with improved thermal performance.

BACKGROUND

Electronics packages are used to provide protection, support, and connections for one or more electronic components therein. However, electronics packages feature one or more components, e.g., dies, that generate heat. This heat can, in turn, negatively affect the performance of the one or more electronic components, and, more generally, the electronics package itself. Accordingly, various techniques have been developed that aim to improve thermal performance by dissipating heat from the one or more heat generating components of these electronics packages.

FIG. 1 illustrates one of these techniques, whereby an electronics package in the form of a socketed CPU 100 is equipped with an integrated heat spreader 104. While difficult to see in FIG. 1, the integrated heat spreader 104 is in thermal contact with a die of the socketed CPU 100, such that heat generated by the die is transferred to the integrated heat spreader 104. This heat is then dissipated via one or more heat sinks that, while not shown in FIG. 1, are spring loaded on the integrated heat spreader 104 in order to achieve a low thermal resistance between the integrated heat spreader 104 and the one or more heat sinks.

FIGS. 2 and 3 illustrate another one of these techniques, whereby a spring-loaded heat sink 200 is installed on an electronics package in the form of a flip chip ball grid array (FCBGA) 204 that is soldered to a printed circuit board (PCB) 208 via solder balls (not shown). In turn, the spring-loaded heat sink 200 dissipates heat generated by a die of the FCBGA 204.

The problem with these and other techniques is that spring-loaded heat sinks such as the spring-loaded heat sink 200 introduce forces and therefore mechanical stresses into the electronics packages and, at least in the case of the technique of FIGS. 2 and 3, into the PCB 208 and the solder balls connecting the FCBGA 204 to the PCB 208 as well. In some cases, it is necessary to install a back plate 400 on the rear side of the PCB 208 in order to strengthen the area and reduce mechanical stresses on the solder balls, the FCBGA 204, and the PCB 208, as is illustrated in FIG. 4.

However, even when a back plate such as the back plate 400 is installed on the rear side of the PCB 208, the solder balls will eventually begin to crack in response to the mechanical stresses introduced by the spring-loaded heat sink 200. Over time, these cracks will cause the soldered connection between the FCBGA 204 and the PCB 208 to fail.

SUMMARY

In accordance with a first exemplary aspect, an electronics assembly is disclosed. The electronics assembly includes a printed circuit board (PCB) including one or more cutouts. The electronics assembly also includes an electronic device and a heat spreader arranged to dissipate heat generated by the electronic device. The heat spreader includes a base surface and one or more legs extending outwardly from the base surface, each of the legs having an end portion soldered in a respective cutout of the one or more cutouts.

In accordance with a second exemplary aspect, an electronics assembly is disclosed. The electronics assembly includes a printed circuit board (PCB) and an integrated circuit package mounted to the PCB. The integrated circuit packing having a heat generating component. The electronics assembly also includes a heat spreader soldered to the PCB such that the heat spreader is thermally coupled to the heat generating component of the integrated circuit package to dissipate heat generated by the heat generating component.

In accordance with a third exemplary aspect, a method of manufacturing an electronics assembly is disclosed. The method includes obtaining a printed circuit board (PCB). The method also includes mounting an integrated circuit package to the PCB, the integrated circuit package having a heat generating component. The method further includes soldering a heat spreader to the PCB such that the heat spreader is thermally coupled to the heat generating component to dissipate heat generated by the heat generating component.

In further accordance with any one or more of the foregoing first, second, or third exemplary aspects, an electronics assembly and/or method of manufacturing an electronics assembly may include any one or more of the following further preferred forms.

In one preferred form, the PCB further includes one or more solder pads disposed in the one or more cutouts. The end portions can be soldered to a respective solder pad.

In another preferred form, each of the legs of the heat spreader curves outward from the base surface.

In another preferred form, the PCB further includes one or more restricted areas surrounding the one or more cutouts, respectively.

In another preferred form, the electronic device includes an electronics package mounted to the PCB. The electronics package has a heat generating component, and the heat spreader is thermally coupled to the heat generating component to dissipate heat generated by the heat generating component.

In another preferred form, the electronic device includes an electronics package mounted to the PCB, the electronics package including a flip chip ball grid array (FCBGA) and the heat generating component comprises a die of the FCBGA.

In another preferred form, the integrated circuit package includes a flip chip ball grid array (FCBGA) and the heat generating component comprises a die of the FCBGA.

In another preferred form, the heat spreader includes a base surface and a plurality of legs extending outwardly from the base surface. The PCB can further include a plurality of cutouts, and the legs can be soldered to a respective cutout of the plurality of cutouts.

In another preferred form, the heat spreader includes a base surface and a plurality of legs extending outwardly from the base surface, each of the legs having an end portion soldered to the PCB.

In another preferred form, the PCB further includes a plurality of cutouts, and the end portions are soldered in a respective cutout of the plurality of the cutouts.

In another preferred form, the PCB further includes a plurality of solder pads disposed in the plurality of cutouts, and the end portions are soldered to a respective solder pad.

In another preferred form, the heat spreader is thermally coupled to the heat generating component via a thermal interface material disposed therebetween.

In another preferred form, the electronics assembly further includes a magnet assembly configured to align the heat spreader relative to the integrated circuit package. The magnet assembly has a first magnet adapted to be coupled to the heat spreader, and a second magnet adapted to be coupled to the integrated circuit package.

In another preferred form, prior to soldering the heat spreader to the PCB, the heat spreader can be positioned in a desired position relative to the heat generating component.

In another preferred form, positioning the heat spreader in the desired position can include coupling a first magnet to the integrated circuit package and a second magnet to the heat spreader, the second magnet magnetically attracted to the first magnet.

In another preferred form, the heat spreader is soldered to the PCB while the first magnet is coupled to the integrated circuit package and the second magnet is coupled to the heat spreader. After the heat spreader is soldered to the PCB, the first magnet can be removed from the integrated circuit package and the second magnet can be removed from the heat spreader.

In another preferred form, obtaining the PCB includes forming one or more cutouts in the PCB, and soldering the heat spreader to the PCB includes disposing one or more legs of the heat spreader within the one or more cutouts, respectively, and soldering one or more end portions of the one or more legs within the one or more cutouts.

In another preferred form, prior to soldering the heat spreader to the PCB, a thermal interface material is applied to the heat generating component.

DETAILED DESCRIPTION

FIGS. 5-11 Illustrate an example of an electronics assembly 500 constructed in accordance with the teachings of the present disclosure. The electronics assembly 500 generally includes a printed circuit board (PCB) 504, an electronics package 508 mounted to the PCB 504, and a heat spreader 512 generally arranged relative to the PCB 504 and the electronics package 508 to dissipate heat generated by the electronics assembly 500. More particularly, the heat spreader 512 is soldered to the PCB 504 in an optimal position relative to the electronics package 508 such that the heat spreader 512 is thermally coupled to one or more heat generating components of the electronics package 508 to effectively and efficiently dissipate heat generated by the heat generating components. Beneficially, the heat spreader 512 effectively and efficiently dissipates heat generated by the heat generating components of the electronics package 508 without imparting any mechanical stress on the electronics package 508, the PCB 504, or other components of the electronics assembly 500.

Figure 6:
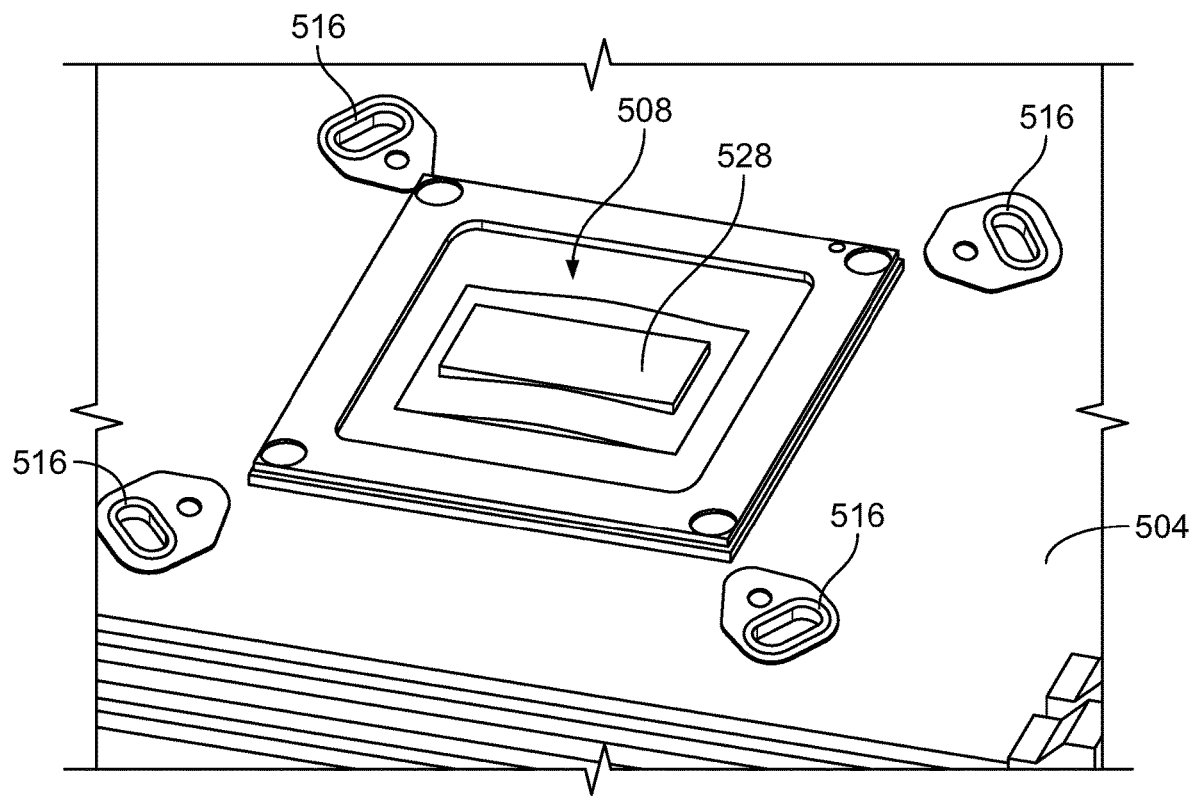
FIG. 6 illustrates a printed circuit board (PCB) and an electronics package of the electronics assembly of FIG. 5, showing that the PCB includes a plurality of cutouts.
Figure 7:
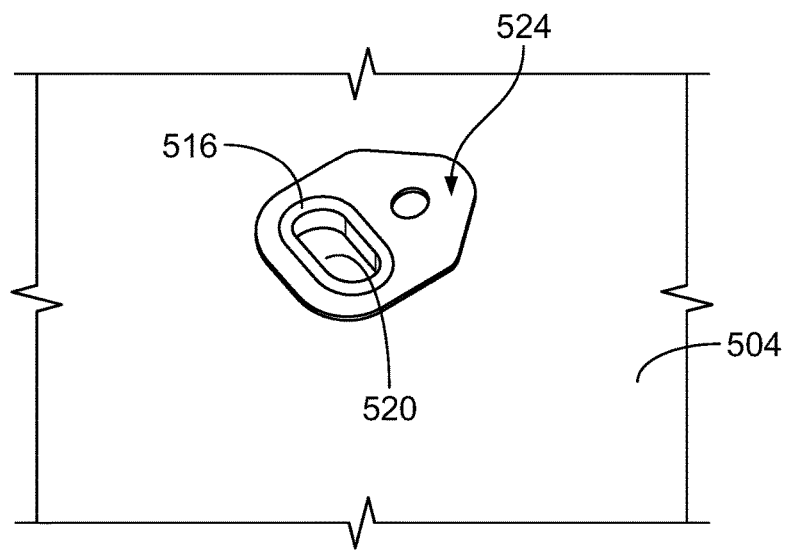
FIG. 7 is a close-up of view of a portion of the PCB, showing one of the cutouts, a solder pad disposed in the cutout, and a restricted area surrounding the cutout.

In this example, the PCB 504 takes the form of a 136 circuit board that includes or is formed of any number of electronics components known in the art. In other examples, however, the PCB 504 may take the form of a different circuit board. The PCB 504 in this example also generally includes one or more cutouts 516 formed therein and one or more solder pads 520 disposed in the one or more cutouts 516, respectively. The one or more cutouts 516 are generally arranged and sized to receive one or more corresponding portions of the heat spreader 512, such that the cutouts 516 are generally arranged (e.g., spaced apart from one another) in a manner that corresponds to the shape and size of the heat spreader 512. Meanwhile, the one or more solder pads 520 are configured to facilitate soldering of the corresponding portions of the heat spreader 512 to the PCB 504. As best illustrated in FIGS. 6 and 7, the PCB 504 in this example includes four cutouts 516 and four solder pads 520 disposed in the four cutouts 516 (only one solder pad 520 is illustrated, in FIG. 7). In other examples, however, the PCB 504 may include one cutout 516 or two, three, or more than four cutouts 516. Preferably, and as illustrated in FIG. 7, the PCB 504 further includes a restricted area 524 surrounding each of the cutouts 516, respectively. Each restricted areas 524 does not include any vias, traces, or other electronics components, thereby providing one or more buffer areas that allow the heat spreader 512 to be soldered to the PCB 504 without damaging any electronic components of the PCB 504. In other examples, however, the PCB 504 may not include any restricted areas 524, and in some examples, the PCB 504 may include one or more vias and/or traces immediately adjacent one or more of the cutouts 516.

The electronics package 508 is generally configured to provide protection, support, and connections for one or more electronic components therein that connect the electronics package 508 to the PCB 504. In this example, the electronics package 508 takes the form of an FCBGA that is soldered to the PCB 504 via a plurality of solder balls (not shown). Thus, in this example, the one or more heat generating components include a die 528 centrally located within the FCBGA. In other examples, however, the electronics package 508 can take the form of a different type of integrated circuit package (e.g., an organic pin-grid array, a pin array cartridge, a pin-grid array, or a ceramic pin-grid array) and/or the integrated circuit package can be mounted to the PCB 504 using a method other than soldering. In the illustrated example or those other examples, the one or more heat generating components may alternatively or additionally include other heat generating components. As an example, the one or more heat generating components may include a resistor. As another example, the one or more heat generating components may include a cover (e.g., a plastic cover, a metal cover) thermally coupled to the die 528 (e.g., via a thermal interface material).

It follows that in this example, the heat spreader 512 is configured to dissipate heat generated by the die 528 of the FCBGA 508. To this end, the heat spreader 512 generally has a base surface 532 that is thermally coupled to the die 528. The base surface 532 illustrated in FIGS. 5 and 8 has a generally rectangular shape, though it will be appreciated that the base surface 532 can instead have a circular, triangular, hexagonal, irregular, or other shape. The base surface 532 is, at least in this example, thermally coupled to the die 528 via a thermal interface material, e.g., a thermal grease, a thermal paste, or a thermal pad, disposed between the die 528 and the base surface 532, which in turn helps to reduce the thermal resistance between the die 528 and the base surface 532 (and the heat spreader 512 more generally).

Figure 1:
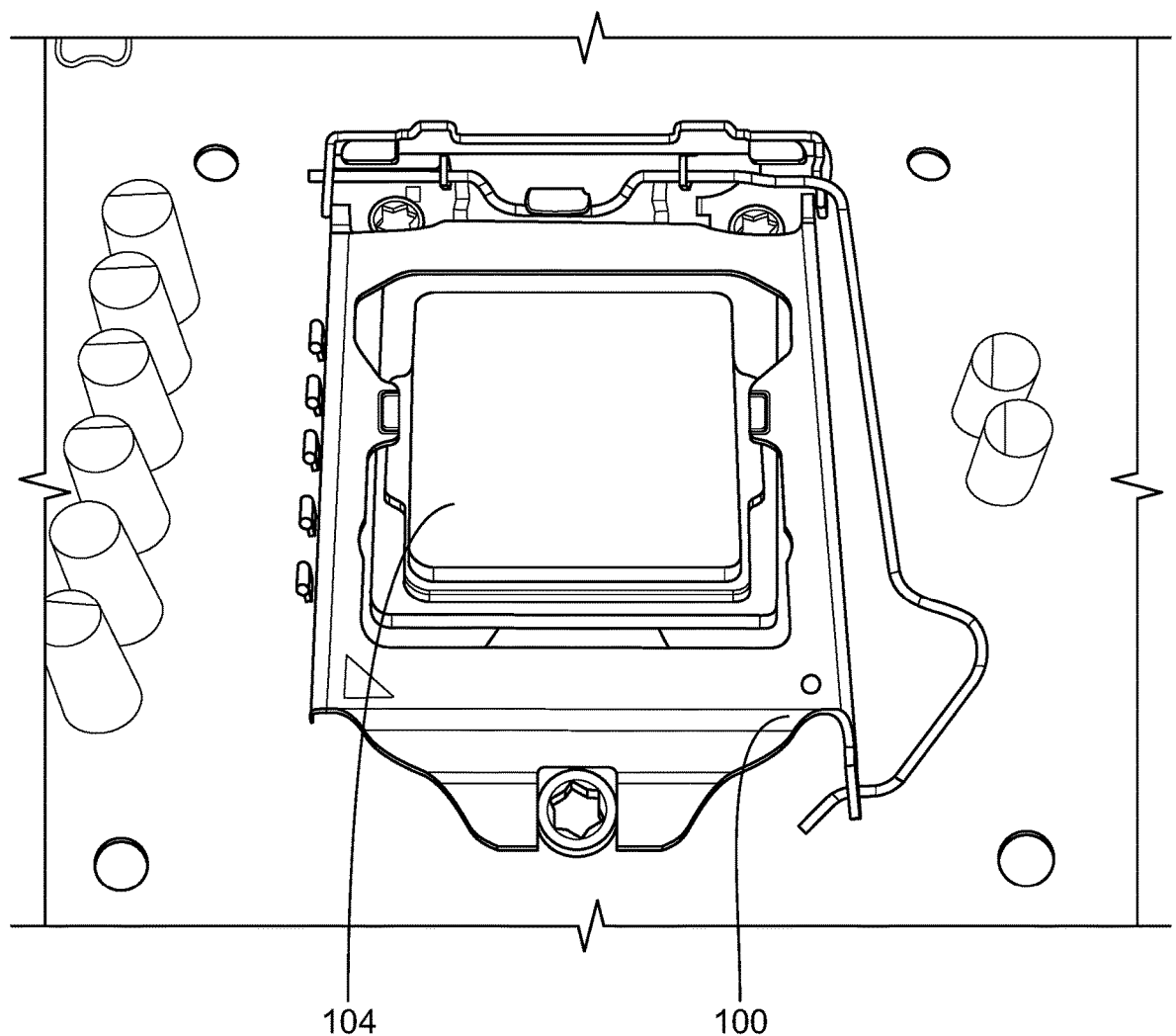
FIG. 1 illustrates a known electronics package with an integrated heat spreader for dissipating heat generated by the electronics package.
Figure 2:
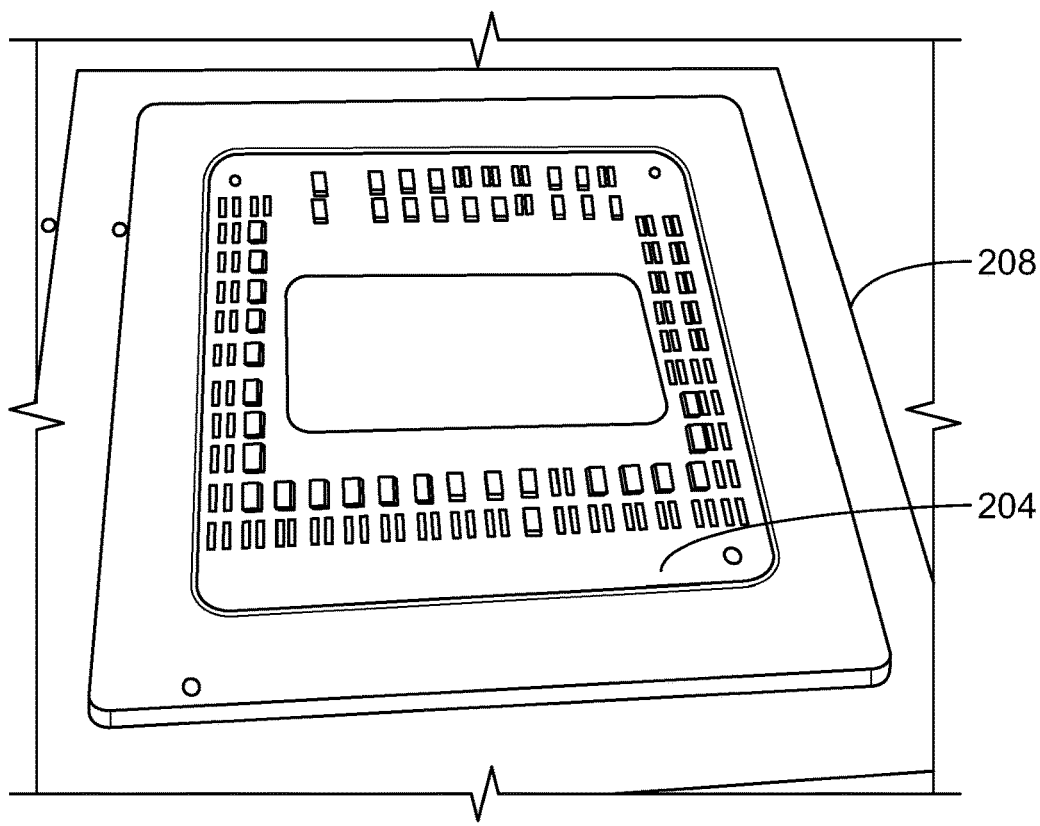
FIG. 2 illustrates another known electronics package.
Figure 3:
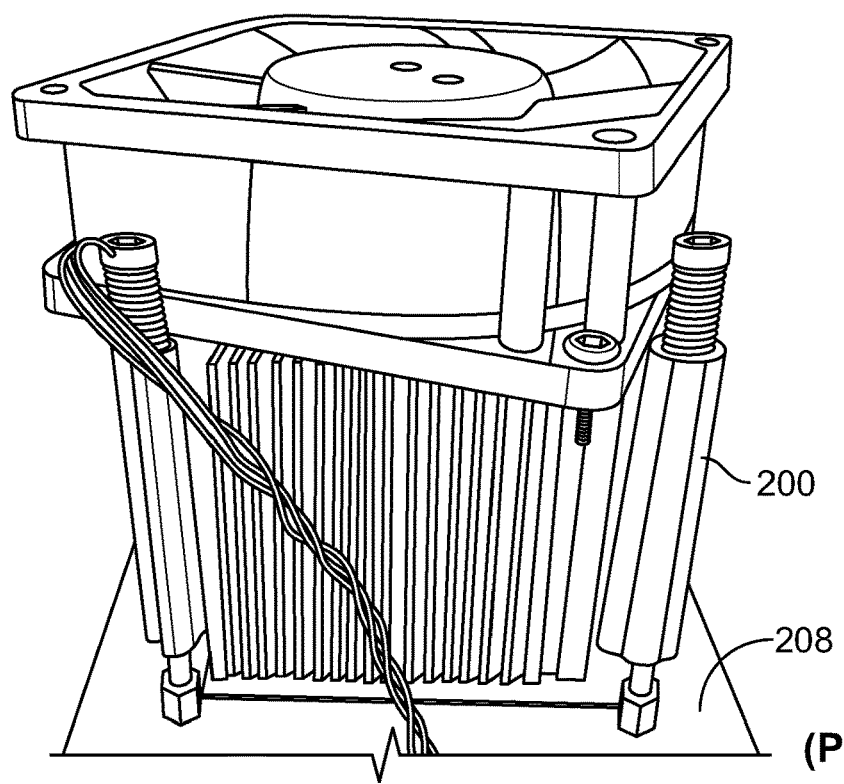
FIG. 3 illustrates a known heat sink for dissipating heat generated by the electronics package of FIG. 2.
Figure 4:
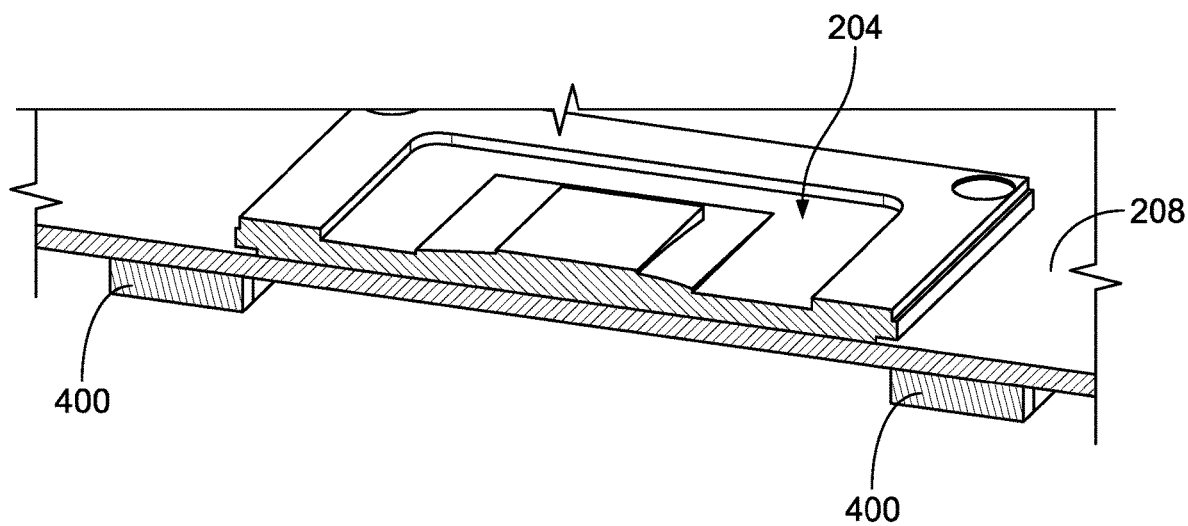
FIG. 4 illustrates another known electronics package that is similar to the electronics package of FIG. 2 but also includes a back plate coupled thereto.
Figure 5:
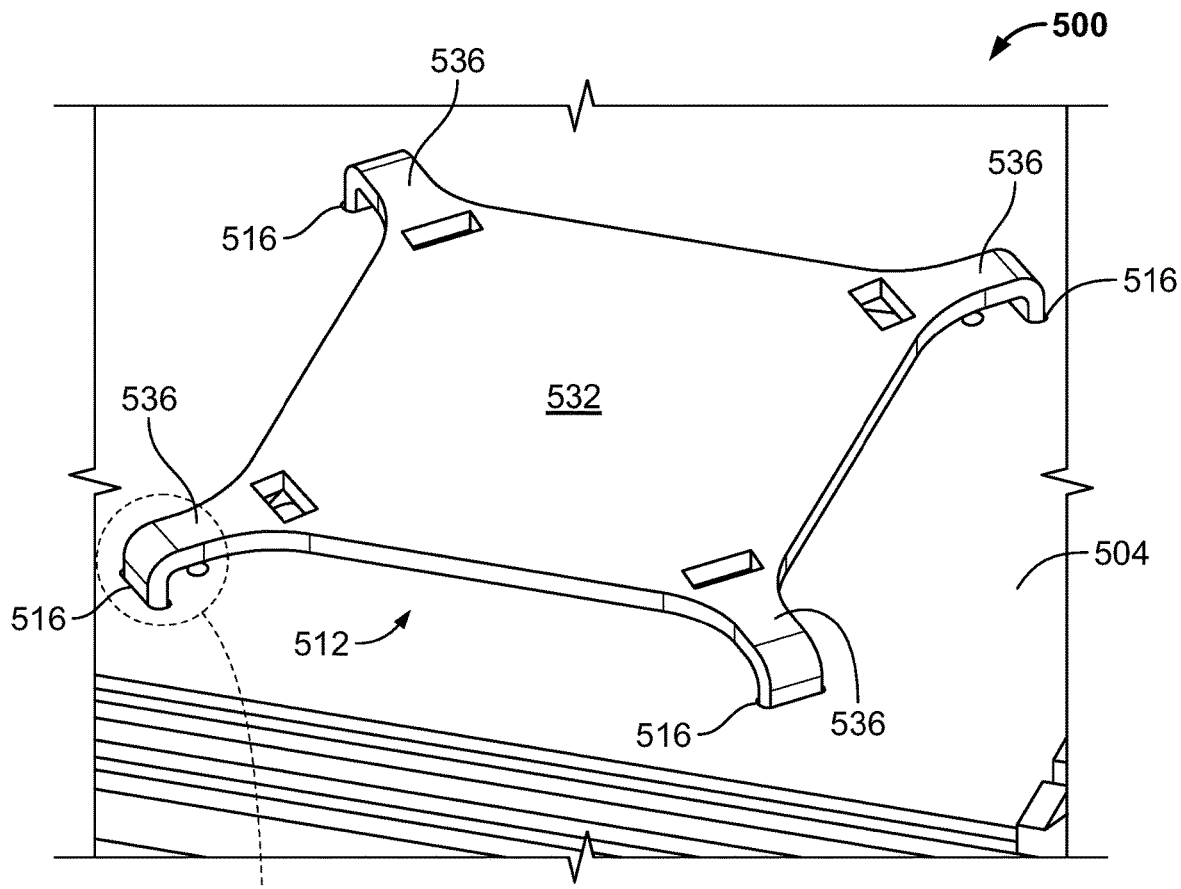
FIG. 5 illustrates an electronics assembly constructed in accordance with the teachings of the present disclosure.
Figure 8:
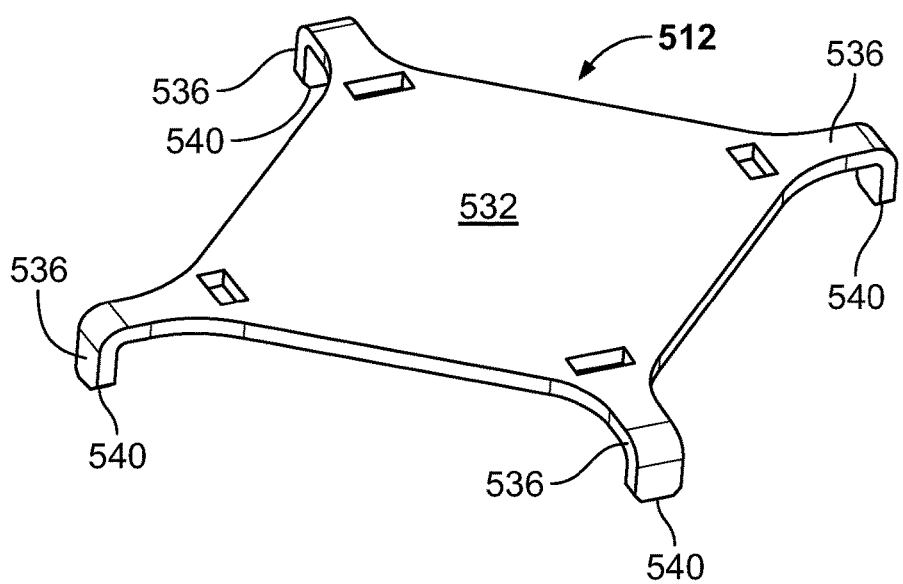
FIG. 8 illustrates a heat spreader of the electronics assembly of FIG. 5.
Figure 9:
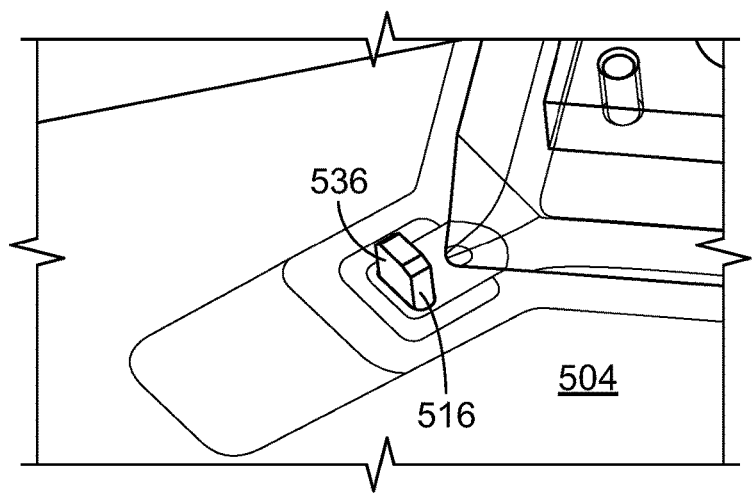
FIG. 9 is a close-up of a portion of FIG. 5, showing one of the legs of the heat spreader disposed within one of the cutouts of the PCB.
Figure 10:
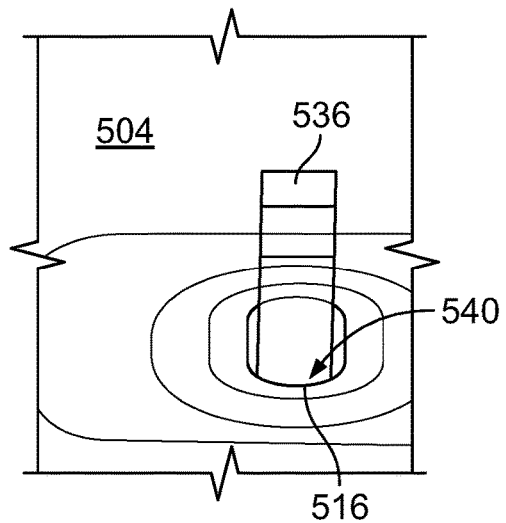
FIG. 10 is similar to FIG. 9.
Figure 11:
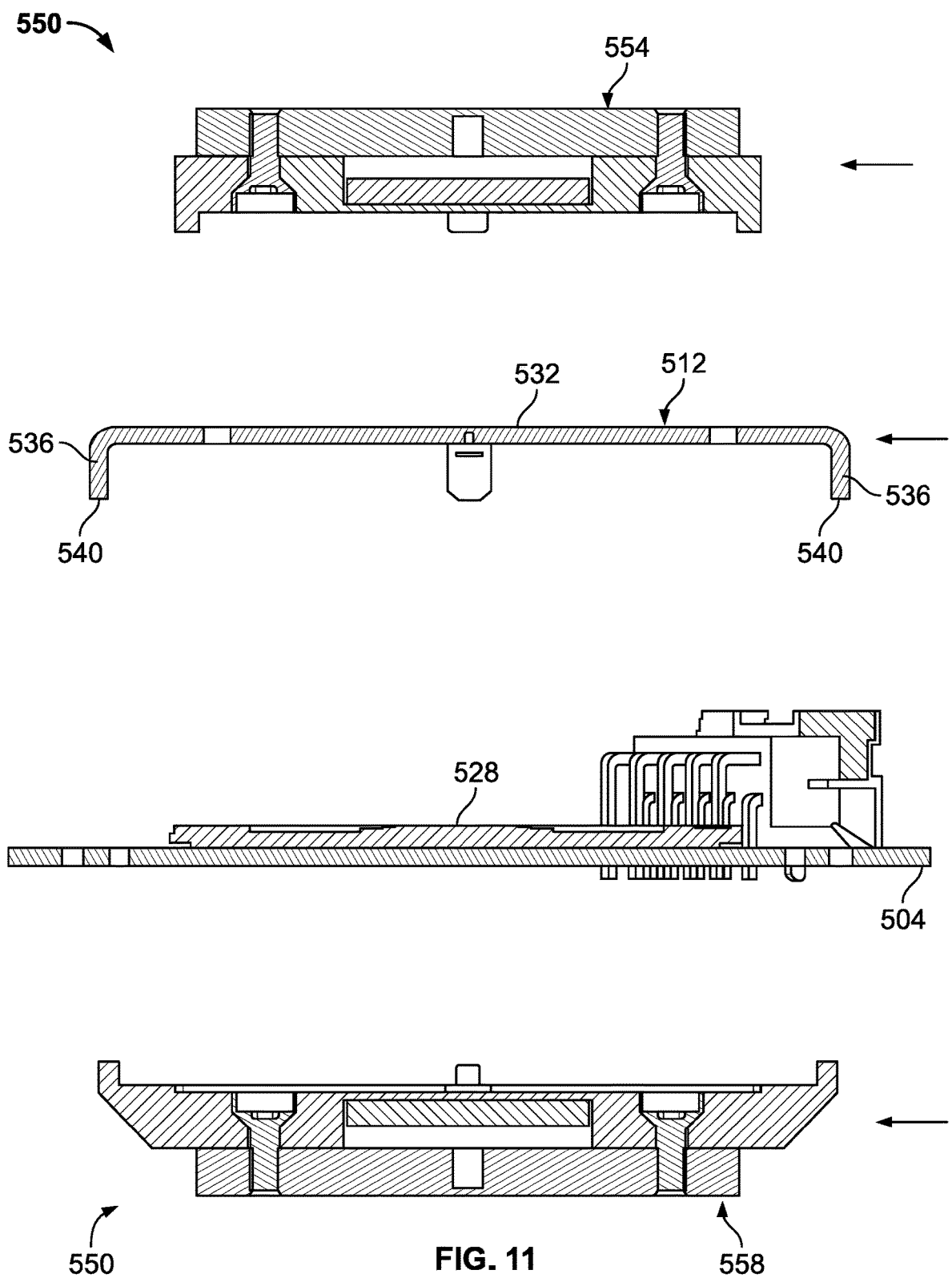
FIG. 11 is an exploded view of the electronics assembly of FIG. 5, but also including a magnet assembly for use in properly positioning the heat spreader relative to the electronics package.

As illustrated in FIGS. 5 and 8, the heat spreader 512 in this example also generally has one or more legs 536 that extend outwardly from the base surface 532 and terminate at one or more end portions 540, respectively. Because the PCB 504 in this example includes four cutouts 516, the heat spreader 512 in this example likewise includes four legs 536 that terminate at four end portions 540 that are soldered within the four cutouts 516 of the PCB 504. As best illustrated in FIG. 5 and FIGS. 9 and 10, which depict one of the legs 536 and its respective end portion 540, the end portions 540 are soldered within the plurality of cutouts 516 of the PCB 504 via the plurality of solder pads 520. The four legs 536 curve outwardly from opposite corners of the base surface 532. Of course, in other examples, e.g., when the PCB 504 includes more or less than four cutouts 516, the heat spreader 512 can include more or less than four legs 536. Moreover, each of the legs 536 can extend outward from the base surface 532 at a different angle. As an example, each of the legs 536 can be substantially straight, such that the legs 536 are perpendicular to the base surface 532.

It will be appreciated that the incorporation of the one or more cutouts 516 into the PCB 504 helps to thermally decouple the base surface 532, which is thermally coupled to the die 528 and not directly soldered to the PCB 504, from the one or more legs 536, which are directly soldered to the PCB 504 via the end portions 540, respectively. In turn, this allows the base surface 532 to be made of or manufactured from a metallic material having a higher thermal conductivity than would otherwise be permitted, as metallic materials having higher thermal conductivities are generally harder to solder than those that have lower thermal conductivities (i.e., thermal conductivity is generally inversely related to solderability). The base surface 532 is preferably made of a sheet metal with a higher thermal conductivity, such as, for example, copper, steel, nickel, tin, or a metal alloy. In some cases, the base surface 532 can be partially or entirely surface treated with a surface material (e.g., gold, nickel, or tin) that is compatible with the metallic material of the base surface 532, can be soldered, and also is thermally conductive. Meanwhile, depending upon which material(s) is(are) used to manufacture the base surface 532, the one or more legs 536 can be made of or manufactured from the same material(s) or one or more other materials.

However, while the heat spreader 512 is fixedly attached to the PCB 504 by soldering the one or more legs 536 of the heat spreader 512 within the one or more cutouts 516 of the PCB 504, it will be appreciated that the heat spreader 512 can be fixedly attached to the PCB 504 in a different manner. As an example, the heat spreader 512 can be fixedly attached to the PCB 504 by soldering the one or more legs 536 of the heat spreader 512 directly to the PCB 504 (in which case the PCB 504 need not include any cutouts 516). As another example, the heat spreader 512 can be glued to the PCB 504 instead of soldered. Also, the heat spreader 512 can be milled or die casted.

Optionally, the electronics assembly 500 can also include a magnet assembly 550 configured to ensure the heat spreader 512 is aligned with (e.g., optimally positioned relative to) the PCB 504 and the electronics package 508, and more particularly the die 528, before the heat spreader 512 is soldered to the PCB 504. The optimal position of the heat spreader 512 will generally vary depending upon the height of the die 512, the parallelism (or lack thereof) of the heat spreader 512 relative to the electronics package 508, the heat generation distribution of the die 528, and/or one or more other factors which are a result of manufacturing tolerances. In one example, the heat spreader 512 will be optimally positioned relative to the die 528 when the heat spreader 512 is centered about the die 528. In another example, the heat spreader 512 will be optimally positioned relative to the die 528 when the surface area contact between the heat spreader 512 and the thermal material is maximized (or when there is any contact at all between the heat spreader 512 and the thermal material). In other examples, the optimal position may further vary.

In any event, the magnet assembly 550 in this example includes a first, or bottom, magnet 558 and a second, or top, magnet 554 that is magnetically attracted to the first magnet 558. The first magnet 558 is adapted to be coupled to the electronics package 508 and, more particularly, a bottom side of the PCB 504 (which is in turn mounted to the package 508), while the second magnet 554 is adapted to be coupled to the heat spreader 512 and, more particularly, a top side of the base surface 532. Thus, when the heat spreader 512, with the second magnet 554 coupled thereto, is positioned in proximity to the electronics package 508 and the first magnet 558 coupled thereto, a magnetic attraction is formed between the first and second magnets 558, 554. This magnetic attraction not only ensures that the heat spreader 512 is optimally positioned relative to the die 528 (e.g., if the heat spreader 512 is not in the optimal position, the magnetic attraction will force the heat spreader 512 into the optimal position), but can be used to hold the heat spreader 512 in this optimal position while the heat spreader 512 is soldered to the PCB 504 in the arrangement described above, all without introducing any mechanical stress into the solder balls used to solder the heat spreader 512 to the PCB 504.

In other examples, other means may be employed to ensure the heat spreader 512 is aligned with (e.g., optimally positioned relative to) the PCB 504 and the electronics package 508, and more particularly the die 528, before the heat spreader 512 is soldered to the PCB 504. In one such example, a single magnet may be used. More particularly, a single magnet that is magnetically attracted to the heat spreader 512 (and vice-versa) may be coupled to the bottom side of the PCB 504 (which is in turn mounted to the package 508). In turn, when the heat spreader 512 is positioned in proximity to the package 508 and the magnet coupled thereto, a magnetic attraction is formed between the magnet and the heat spreader, and this magnetic attraction can serve the same purpose as the magnetic attraction discussed above. In another such example, one or more weights and/or one or more springs can be coupled to the heat spreader 512 and/or the PCB 504 to hold the heat spreader 512 in the optimal position while the heat spreader 512 is soldered to the PCB 504.

Optionally, the electronics assembly 500 can also include a heat sink, e.g., the spring-loaded heat sink 200. The heat sink is generally thermally coupled to the heat spreader 512 in order to facilitate dissipation of the heat generated by the die 528 and transferred to the heat spreader 512. In some examples, the heat sink is thermally coupled to the heat spreader 512 via a thermal material, e.g., a thermal grease, a thermal paste, or a thermal pad, disposed between the heat sink and the heat spreader 512.

Figure 12:
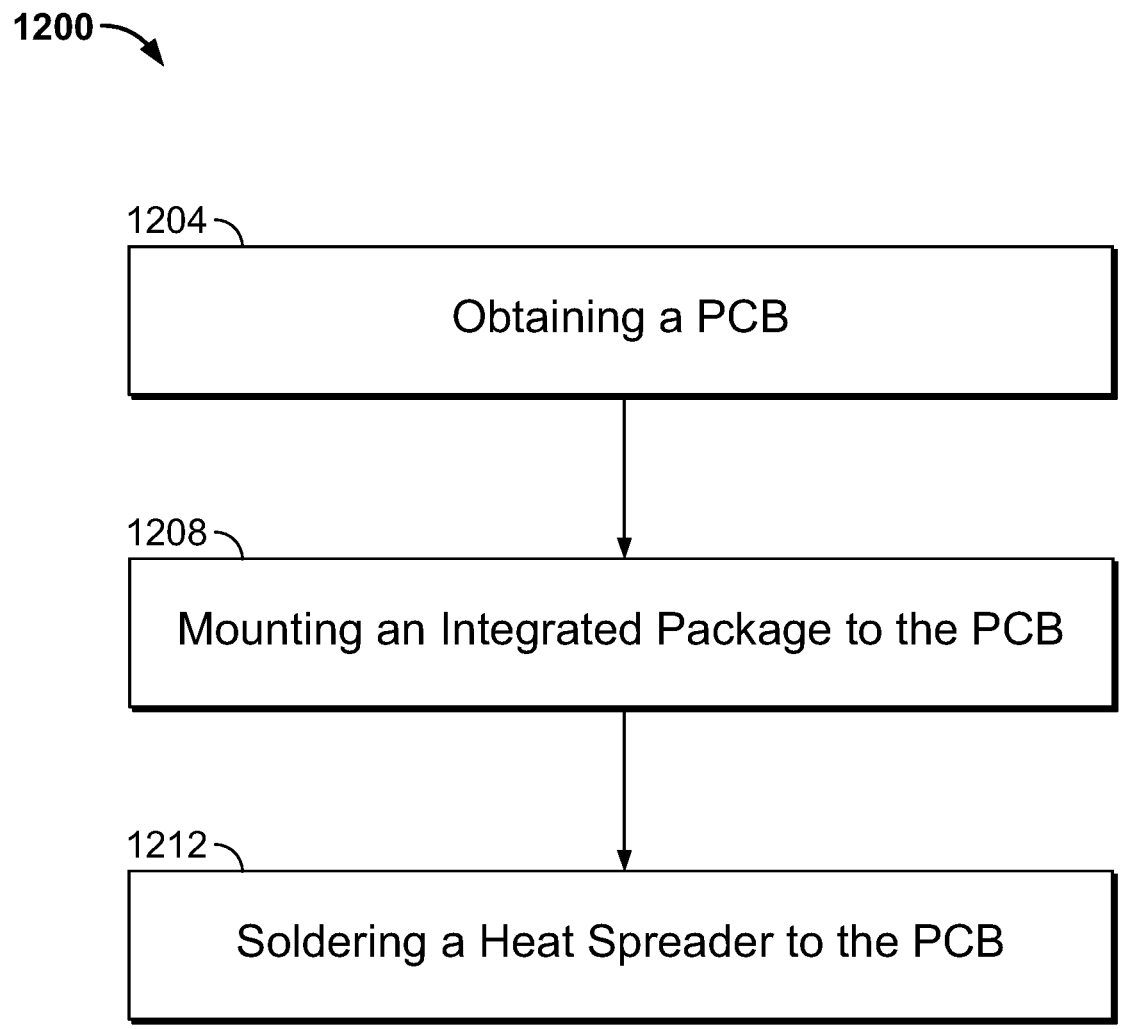
FIG. 12 is a schematic diagram of one example of a method or process of manufacturing an electronics assembly in accordance with the teachings of the present disclosure.

FIG. 12 depicts an example of a method or process 1200 for manufacturing an electronics assembly such as the electronics assembly 500. The method or process 1200 is performed in the order shown and described herein, but may be implemented in or according to any number of different orders. The method or process 1200 may, in other examples, include additional, fewer, or different acts.

The method 1200 first includes the act of obtaining a printed circuit board (PCB), e.g., the PCB 504 (block 1204). In some examples, obtaining the PCB may include manufacturing the PCB, but in other examples obtaining the PCB may include retrieving an already manufactured PCB. In some examples, obtaining the PCB may include forming one or more cutouts (e.g., the cutouts 516) in the PCB. In other examples, the provided PCB may already include the one or more cutouts or may not include any cutouts at all.

The method 1200 then includes the act of mounting an integrated circuit package (e.g., the integrated circuit package 508) to the PCB (block 1208). The integrated circuit package generally includes a heat generating component such as a die (e.g., the die 528). In some examples, the integrated circuit package is mounted to the PCB by soldering (e.g., using a surface mount soldering process, a wave soldering processor any other known soldering process).

The method 1200 further includes the act of soldering a heat spreader (e.g., the heat spreader 512) to the PCB (block 1212). The heat spreader can be soldered to the PCB using a surface mount soldering process, a wave soldering processor any other known soldering process. In some examples, e.g., when the PCB includes cutouts, the act of soldering includes disposing one or more legs (e.g., legs 536) of the heat spreader within the one or more cutouts, respectively, and soldering end portions (e.g., end portions 540) of the one or more legs within the one or more cutouts. In any event, the heat spreader is soldered to the PCB such that the heat spreader is thermally coupled to the heat generating component to dissipate heat generated by the heat generating component.

In some examples, the method 1200 may further include, prior to soldering the heat spreader to the PCB, applying a thermal interface material (e.g., thermal grease) to the heat generating component. Alternatively or additionally, the method 1200 may further include, prior to soldering the heat spreader to the PCB, positioning the heat spreader in a desired position relative to the heat generating component and holding the heat spreader in the desired position. In some examples, the heat spreader may be moved to the desired position and held in that desired position using a magnet assembly (e.g., the magnet assembly 550). In one example, using the magnet assembly includes coupling a first magnet (e.g., the magnet 558) to the integrated circuit package and a second magnet (e.g., the magnet 554) to the heat spreader, the second magnet being magnetically attracted to the first magnet. In this example, the heat spreader may be soldered to the PCB while the first magnet is coupled to the integrated circuit package and the second magnet is coupled to the heat spreader, thereby ensuring that the heat spreader is soldered in the desired position relative to the heat generating component. After the heat spreader is soldered to the PCB, the first magnet can be removed from the integrated circuit package and the second magnet can be removed from the heat spreader. In other examples, the heat spreader can be positioned in the desired position relative to the heat generating component and held in the desired position using a single weight, one or more weights, and/or one or more springs.

In some examples, the method or process 1200 may also include manufacturing any of the components described herein. As an example, the method or process 1200 may include the act of manufacturing the PCB, the integrated circuit package, and/or the heat spreader. Manufacturing can be performed using a conventional manufacturing technique and/or an additive manufacturing technique. The additive manufacturing technique may be any additive manufacturing technique or process that builds three-dimensional objects by adding successive layers of material on a material. The additive manufacturing technique may be performed by any suitable machine or combination of machines. The additive manufacturing technique may typically involve or use a computer, three-dimensional modeling software (e.g., Computer Aided Design, or CAD, software), machine equipment, and layering material. Once a CAD model is produced, the machine equipment may read in data from the CAD file and layer or add successive layers of liquid, powder, sheet material (for example) in a layer-upon-layer fashion to fabricate a three-dimensional object. The additive manufacturing technique may include any of several techniques or processes, such as, for example, a stereolithography ("SLA") process, a fused deposition modeling ("FDM") process, multi-jet modeling ("MJM") process, and a selective laser sintering ("SLS") process. In some embodiments, the additive manufacturing process may include a directed energy laser deposition process. Such a directed energy laser deposition process may be performed by a multi-axis computer-numerically-controlled ("CNC") lathe with directed energy laser deposition capabilities.

Preferred embodiments of this invention are described herein, including the best mode or modes known to the inventors for carrying out the invention. Although numerous examples are shown and described herein, those of skill in the art will readily understand that details of the various embodiments need not be mutually exclusive. Instead, those of skill in the art upon reading the teachings herein should be able to combine one or more features of one embodiment with one or more features of the remaining embodiments. Further, it also should be understood that the illustrated embodiments are exemplary only, and should not be taken as limiting the scope of the invention. All methods described herein can be performed in any suitable order unless otherwise indicated herein or otherwise clearly contradicted by context. The use of any and all examples, or exemplary language (e.g., "such as") provided herein, is intended merely to better illuminate the aspects of the exemplary embodiment or embodiments of the invention, and do not pose a limitation on the scope of the invention. No language in the specification should be construed as indicating any non-claimed element as essential to the practice of the invention.

The invention claimed is:

1. A method of manufacturing an electronics assembly, comprising:
    obtaining a printed circuit board (PCB);
    mounting an electronics package to the PCB, the electronics package having a heat generating component;
    soldering a heat spreader to the PCB such that the heat spreader is thermally coupled to the heat generating component to dissipate heat generated by the heat generating component; and
    prior to soldering the heat spreader to the PCB, positioning the heat spreader in a desired position relative to the heat generating component,
    wherein positioning the heat spreader in the desired position comprises coupling a first magnet to the electronics package or the heat spreader.

2. The method of manufacturing of claim 1, wherein the electronics package comprises an integrated circuit package.

3. The method of manufacturing of claim 2, wherein the integrated circuit package comprises a flip chip ball grid array (FCBGA) and the heat generating component comprises a die of the FCBGA.

4. The method of manufacturing of claim 1, wherein the act of soldering the heat spreader to the PCB is performed while the first magnet is coupled to the electronics package or the heat spreader, and further comprising, after the act of soldering the heat spreader to the PCB, decoupling the first magnet from the electronics package or the heat spreader.

5. The method of manufacturing of claim 1, wherein the heat spreader comprises a base surface and one or more legs that curve outwardly from the base surface, and wherein soldering the heat spreader to the PCB comprises soldering an end portion of each of the legs to the PCB.

6. The method of manufacturing of claim 1,
    wherein when the first magnet is coupled to the electronics package, the method further comprises coupling a second magnet to the heat spreader, the second magnet magnetically attracted to the first magnet, and
    wherein when the first magnet is coupled to the heat spreader, the method further comprises coupling the second magnet to the electronics package.

7. A method of manufacturing an electronics assembly, comprising:
    obtaining a printed circuit board (PCB);
    mounting an electronics package to the PCB, the electronics package having a heat generating component;
    soldering a heat spreader to the PCB such that the heat spreader is thermally coupled to the heat generating component to dissipate heat generated by the heat generating component; and
    prior to soldering the heat spreader to the PCB, positioning the heat spreader in a desired position relative to the heat generating component,
    wherein positioning the heat spreader in the desired position comprises coupling a first magnet to the electronics package and a second magnet to the heat spreader, the second magnet magnetically attracted to the first magnet.

8. The method of manufacturing of claim 7, wherein the act of soldering the heat spreader to the PCB is performed while the first magnet is coupled to the electronics package and the second magnet is coupled to the heat spreader, and further comprising, after the act of soldering the heat spreader to the PCB, decoupling the first magnet from the electronics package and removing the second magnet from the heat spreader.

9. A method of manufacturing an electronics assembly, comprising:
    obtaining a printed circuit board (PCB), the PCB comprising one or more cutouts;
    mounting an electronics package to the PCB, the electronics package having a heat generating component;
    soldering a heat spreader to the PCB such that the heat spreader is thermally coupled to the heat generating component to dissipate heat generated by the heat generating component; and
    prior to soldering the heat spreader to the PCB, positioning the heat spreader in a desired position relative to the heat generating component,
    wherein the heat spreader comprises a base surface and one or more legs extending outwardly from the base surface, wherein soldering the heat spreader to the PCB comprises disposing the one or more legs of the heat spreader within the one or more cutouts, respectively, and soldering an end portion of each of the one or more legs in a respective cutout of the one or more cutouts, and
    wherein positioning the heat spreader in the desired position comprises coupling a first magnet to the electronics package or the heat spreader.

10. The method of manufacturing of claim 9, wherein the PCB further comprises one or more solder pads disposed in the one or more cutouts, respectively, and wherein soldering the end portion of each of the one or more legs in the respective cutout of the one or more cutouts comprises soldering the end portion of each of the one or more legs to a respective one of the solder pads disposed in the one or more cutouts.

11. The method of manufacturing of claim 9, wherein the one or more legs curve outwardly from the base surface.

12. The method of manufacturing of claim 9, wherein the electronics package comprises an integrated circuit package.

13. The method of manufacturing of claim 12, wherein the integrated circuit package comprises a flip chip ball grid array (FCBGA) and the heat generating component comprises a die of the FCBGA.

14. The method of manufacturing of claim 9, further comprising, prior to soldering the heat spreader to the PCB, applying a thermal material to the heat generating component.

15. The method of manufacturing of claim 9, wherein the act of soldering the heat spreader to the PCB is performed while the first magnet is coupled to the electronics package or the heat spreader, and further comprising, after the act of soldering the heat spreader to the PCB, decoupling the first magnet from the electronics package or the heat spreader.

16. The method of manufacturing of claim 4, wherein positioning the heat spreader in the desired position comprises coupling the first magnet to the electronics package and coupling a second magnet to the heat spreader, the second magnet magnetically attracted to the first magnet.

17. The method of manufacturing of claim 16, wherein the act of soldering the heat spreader to the PCB is performed while the first magnet is coupled to the electronics package and the second magnet is coupled to the heat spreader, and further comprising, after the act of soldering the heat spreader to the PCB, decoupling the first magnet from the electronics package and removing the second magnet from the heat spreader.

18. The method of manufacturing of claim 9,
wherein when the first magnet is coupled to the electronics package, the method further comprises coupling a second magnet to the heat spreader, the second magnet magnetically attracted to the first magnet, and
wherein when the first magnet is coupled to the heat spreader, the method further comprises coupling the second magnet to the electronics package.

* * * * *